US012597588B2

(12) United States Patent
Alexandrovich et al.

(10) Patent No.: US 12,597,588 B2
(45) Date of Patent: Apr. 7, 2026

(54) INDUCTIVELY COUPLED PLASMA APPARATUS WITH NOVEL FARADAY SHIELD

(71) Applicant: Applied Materials, Inc., Santa Clara, CA (US)

(72) Inventors: Benjamin Alexandrovich, Brookline, MA (US); Peter F. Kurunczi, Cambridge, MA (US); David Morrell, Wakefield, MA (US); Adam Calkins, Newmarket, NH (US)

(73) Assignee: Applied Materials, Inc., Santa Clara, CA (US)

( * ) Notice: Subject to any disclaimer, the term of this patent is extended or adjusted under 35 U.S.C. 154(b) by 348 days.

(21) Appl. No.: 18/198,682

(22) Filed: May 17, 2023

(65) Prior Publication Data

US 2024/0387151 A1 Nov. 21, 2024

(51) Int. Cl.
H01J 37/32 (2006.01)
H01Q 7/00 (2006.01)
(52) U.S. Cl.
CPC ..... H01J 37/32651 (2013.01); H01J 37/3211 (2013.01); H01Q 7/00 (2013.01); *H01J 2237/0451* (2013.01)
(58) Field of Classification Search
CPC ............. H01J 37/32651; H01J 37/3211; H01J 2237/0451; H01J 37/321; H01J 37/32119; H01J 37/32082; H01J 37/3244; H01J 37/32174; H01Q 7/00; C23C 16/507; C23C 16/455; C23C 16/45591; C23C 16/4412; C23C 16/452

USPC .... 118/723 I, 1, 723 IR; 156/345.48, 345.49
See application file for complete search history.

(56) References Cited

U.S. PATENT DOCUMENTS

| | | | | | |
|---|---|---|---|---|---|
| 5,560,776 | A | * | 10/1996 | Sugai | .................... H01J 37/321 |
| | | | | | 204/298.34 |
| 5,897,713 | A | * | 4/1999 | Tomioka | ............... H01J 37/321 |
| | | | | | 156/345.48 |
| 5,932,302 | A | * | 8/1999 | Yamazaki | ............. C23C 16/545 |
| | | | | | 427/127 |
| 6,083,363 | A | | 7/2000 | Ashtiani | |

(Continued)

FOREIGN PATENT DOCUMENTS

WO        2021123728 A1      6/2021

OTHER PUBLICATIONS

International Search Report and Written Opinion for International Application No. PCT/US2024/029284, mailed on Sep. 5, 2024, 10 pages.

*Primary Examiner* — Rudy Zervigon
(74) *Attorney, Agent, or Firm* — KDW, PLLC

(57) ABSTRACT

An antenna assembly. The antenna assembly may include an antenna, having a loop structure, and a dielectric window, adjacent to the antenna. The antenna assembly may also include a Faraday shield assembly disposed between the antenna and the dielectric window, where the Faraday shield assembly is disposed at least partially around the antenna. The Faraday shield assembly may include a plurality of metallic sections, electrically isolated from one another, where the plurality of metallic sections are arranged into a plurality of shield pairs. As such, a first metallic section and a second metallic section of a given shield pair may be disposed opposite one another and may be electrically connected to one another.

19 Claims, 6 Drawing Sheets

(56)  References Cited

U.S. PATENT DOCUMENTS

| | | | | |
|---|---|---|---|---|
| 6,096,389 | A * | 8/2000 | Kanai | C23C 16/511 |
| | | | | 118/723 MR |
| 6,181,069 | B1 | 1/2001 | Tonotani | |
| 6,203,620 | B1 * | 3/2001 | Moslehi | H01J 37/321 |
| | | | | 156/345.35 |
| 7,591,232 | B2 * | 9/2009 | Vukovic | H01J 37/32477 |
| | | | | 156/345.48 |
| RE40,963 | E * | 11/2009 | Ishii | H05H 1/46 |
| | | | | 427/571 |
| 2002/0023899 | A1 * | 2/2002 | Khater | H01J 37/321 |
| | | | | 219/121.41 |
| 2002/0121345 | A1 * | 9/2002 | Chen | C23C 16/507 |
| | | | | 156/345.48 |
| 2003/0056901 | A1 * | 3/2003 | Nakano | H01J 37/32082 |
| | | | | 156/345.47 |
| 2006/0057854 | A1 * | 3/2006 | Setsuhara | H01J 37/321 |
| | | | | 438/710 |
| 2011/0240876 | A1 | 10/2011 | Sinclair | |
| 2011/0297320 | A1 * | 12/2011 | Sakka | H01J 37/3211 |
| | | | | 156/345.48 |
| 2012/0080148 | A1 * | 4/2012 | Zhang | H01J 37/08 |
| | | | | 156/345.48 |
| 2012/0273341 | A1 * | 11/2012 | Agarwal | H05H 1/46 |
| | | | | 156/345.28 |
| 2014/0342568 | A1 * | 11/2014 | Sant | G05D 23/22 |
| | | | | 438/710 |
| 2015/0311040 | A1 * | 10/2015 | Kawaguchi | H01J 37/32137 |
| | | | | 156/345.28 |
| 2017/0053782 | A1 | 2/2017 | O'Neill | |
| 2017/0278680 | A1 * | 9/2017 | Peng | H01J 37/32477 |
| 2018/0240652 | A1 * | 8/2018 | Ma | H01J 37/32651 |
| 2018/0286639 | A1 * | 10/2018 | Zucker | H01J 37/32449 |
| 2018/0374685 | A1 | 12/2018 | Collins | |
| 2021/0183619 | A1 * | 6/2021 | Patrick | H01J 37/32165 |

* cited by examiner

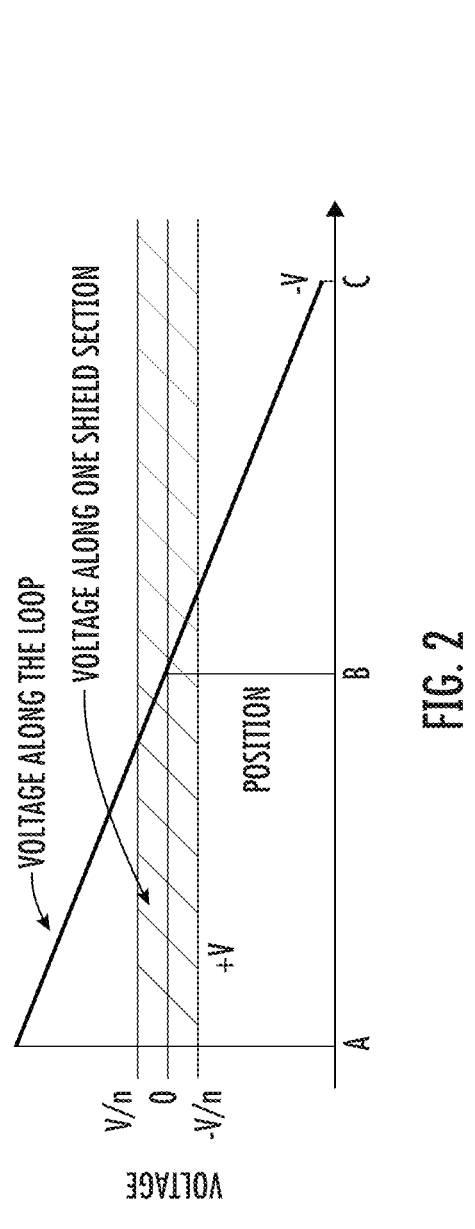
FIG. 2
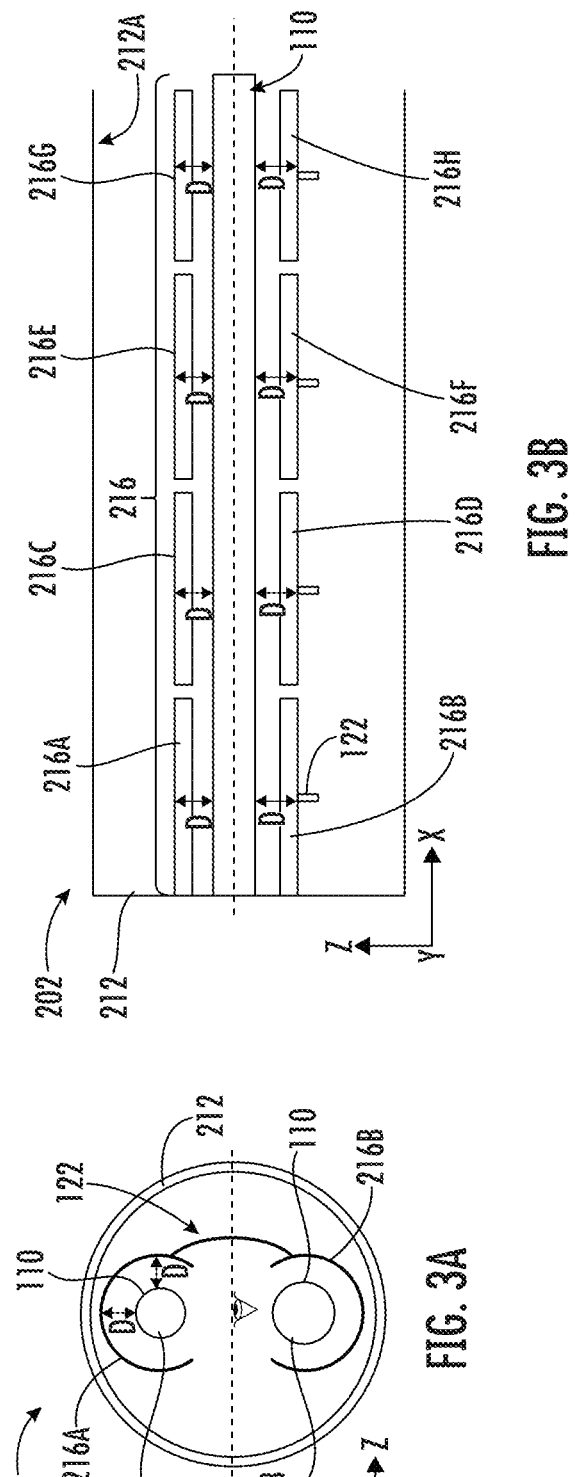
FIG. 3B
FIG. 3A

INDUCTIVELY COUPLED PLASMA APPARATUS WITH NOVEL FARADAY SHIELD

FIELD OF THE DISCLOSURE

The disclosure relates generally to processing apparatus, and more particularly to antenna assemblies to generate inductively coupled plasmas for use in processing tools, including plasma based ion sources.

BACKGROUND OF THE DISCLOSURE

In the present day, plasmas are used to process substrates, such as electronic devices, for applications such as substrate etching, layer deposition, ion implantation, and other processes. Some processing apparatus employ a plasma chamber that generates a plasma to act as an ion source for substrate processing. An ion beam may be extracted through an extraction assembly and directed to a substrate in an adjacent chamber. This plasma may be generated in various ways.

In various commercial systems, an antenna structure is used to generate an inductively coupled plasma (ICP). The antenna is excited using an RF power supply, and is used to couple to a chamber containing an ionizable gas, where the antenna is separated from the ionizable gas by a dielectric material, such as a dielectric window or dielectric shield.

RF current in the antenna induces a time-varying magnetic field, B(t) penetrating into a plasma through the dielectric material. This B(t) flux induces RF circular electric field E(t) and current Ip(t) in the plasma. The plasma electrons gain energy from the electric field and ionize gas neutrals, thus sustaining the plasma equilibrium density. In ICP sources, the plasma density is proportional to the antenna magnetic flux penetrating into the plasma, and the RF power transfer efficiency depends on magnetic coupling of the antenna to plasma.

To facilitate magnetic coupling the antenna is placed in close proximity to the dielectric window, which proximity creates an adverse effect due to the capacitive coupling of the antenna to the dielectric and the electric field within the dielectric material—plasma sheath. The plasma ions that reach the edge of the plasma that is adjacent to the plasma sheath are accelerated by this electric field towards the dielectric material, such as a dielectric window, which acceleration may cause the plasma ions to achieve sufficient energy to cause dielectric window erosion and material sputtering. The rate of erosion is strongly dependent upon the magnitude of the voltage that develops across the plasma sheath. For many types of plasma processing equipment the RF sheath voltage is to be minimized below a certain threshold level to avoid such deleterious effects that occur when ions reach a certain threshold energy.

In practical ICP sources electrostatic (capacitive) coupling of the antenna to plasma creates additional RF voltage across the plasma boundary sheath (or simply "plasma sheath"). In certain antenna designs, such as two terminal ends of a loop antenna, the voltage may become unacceptably high, such that the plasma sheath voltage may exceed a sputtering threshold, resulting in sputtering of material from the nearby portions of the dielectric window.

Known ICP antenna designs may include a Faraday shield structure that is placed between the antenna and the dielectric window, such that the Faraday shield structure serves to reduce the capacitive coupling and the concomitant magnitude of the RF sheath voltage. One drawback of the use of Faraday shields is that the magnetic coupling from antenna to plasma is reduced, thus decreasing the antenna power loss and power demand from the RF source.

With respect to these and other considerations the present disclosure is provided.

BRIEF SUMMARY

In one embodiment, an antenna assembly is provided. The antenna assembly may include an antenna, having a loop structure, and a dielectric window, adjacent to the antenna. The antenna assembly may also include a Faraday shield assembly disposed between the antenna and the dielectric window, where the Faraday shield assembly is disposed at least partially around the antenna. The Faraday shield assembly may include a plurality of metallic sections, electrically isolated from one another, where the plurality of metallic sections are arranged into a plurality of shield pairs. As such, a first metallic section and a second metallic section of a given shield pair may be disposed opposite one another and may be electrically connected to one another.

In another embodiment, a plasma source is provided. The plasma source may include a plasma chamber, the plasma chamber surrounding a plasma space to contain a plasma therein, and an antenna assembly, disposed within the plasma chamber or adjacent to the plasma chamber. The antenna assembly may include an antenna, having a loop structure, and a dielectric window, adjacent to the antenna. The antenna assembly may also include a Faraday shield assembly disposed between the antenna and the dielectric window, where the Faraday shield assembly is disposed at least partially around the antenna. The Faraday shield assembly may include a plurality of metallic sections, electrically isolated from one another, where the plurality of metallic sections are arranged into a plurality of shield pairs. As such, a first metallic section and a second metallic section of a given shield pair may be disposed opposite one another and may be electrically connected to one another.

In a further embodiment, a processing apparatus is provided. The processing apparatus may include a plasma chamber, the plasma chamber surrounding a plasma space to contain a plasma therein, an extraction plate, disposed on a side of the plasma chamber, and an antenna assembly, disposed within the plasma chamber or adjacent to the plasma chamber. The antenna assembly may include an antenna, having a loop structure, a dielectric window, adjacent to the antenna; and a Faraday shield assembly disposed between the antenna and the dielectric window, where the Faraday shield assembly is disposed at least partially around the antenna. As such, the Faraday shield assembly may include a plurality of metallic sections, electrically isolated from one another, wherein the plurality of metallic sections are arranged into a plurality of shield pairs. The processing apparatus may further include an RF assembly, coupled to provide a balanced RF voltage signal to a first terminal end and a second terminal end of the antenna.

BRIEF DESCRIPTION OF THE DRAWINGS

FIG. 2 shows a voltage distribution along an antenna assembly, arranged according to embodiments of the disclosure;

FIG. 3A shows an end cross-sectional view of an antenna assembly arranged according to additional embodiments of the disclosure;

FIG. 3B illustrates a side view of the antenna assembly of FIG. 3A;

Figure 1:
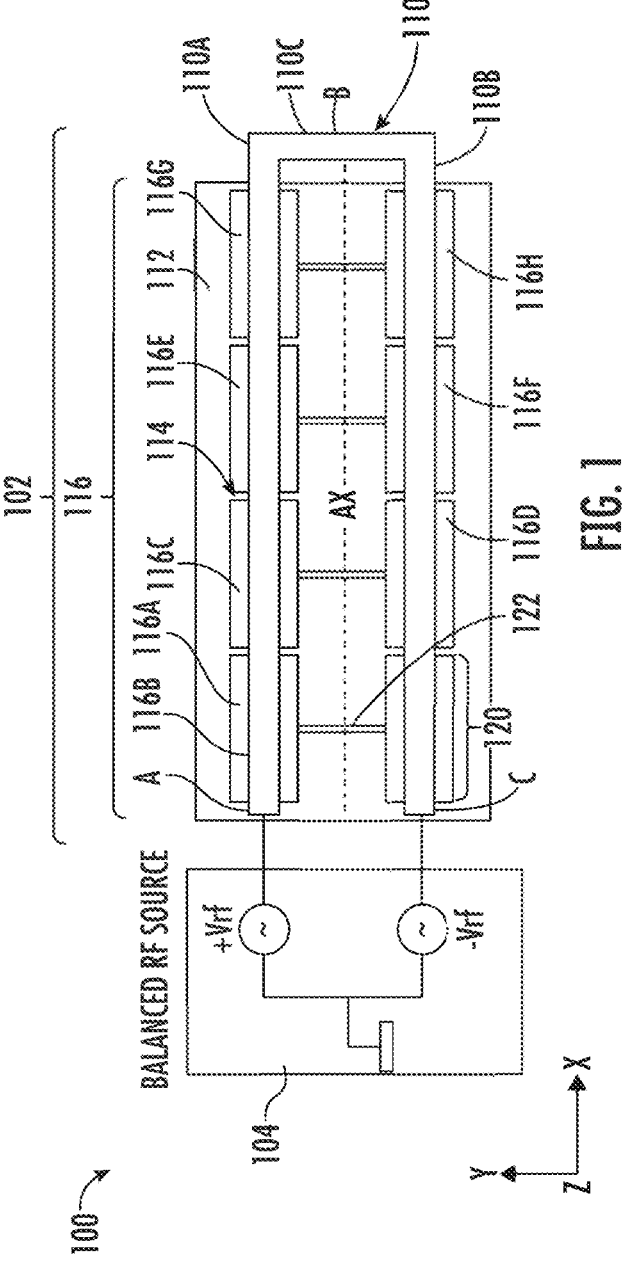
FIG. 1 shows an antenna assembly, according to embodiments of the disclosure.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

DETAILED DESCRIPTION

An apparatus, system and method in accordance with the present disclosure will now be described more fully hereinafter with reference to the accompanying drawings, where embodiments of the system and method are shown. The system and method may be embodied in many different forms and are not be construed as being limited to the embodiments set forth herein. Instead, these embodiments are provided so this disclosure will be thorough and complete, and will fully convey the scope of the system and method to those skilled in the art.

Terms such as "top," "bottom," "upper," "lower," "vertical," "horizontal," "lateral," and "longitudinal" may be used herein to describe the relative placement and orientation of these components and their constituent parts, with respect to the geometry and orientation of a component of a semiconductor manufacturing device as appearing in the figures. The terminology may include the words specifically mentioned, derivatives thereof, and words of similar import.

As used herein, an element or operation recited in the singular and proceeded with the word "a" or "an" are understood as potentially including plural elements or operations as well. Furthermore, references to "one embodiment" of the present disclosure are not intended to be interpreted as precluding the existence of additional embodiments also incorporating the recited features.

Provided herein are antenna assemblies for improved inductively coupled plasma (ICP) plasma sources.

Turning to the figures, FIG. 1 shows an antenna assembly, according to embodiments of the disclosure. The antenna assembly 102 is shown in a circuit arrangement 100 that includes an RF assembly 104, used to drive an antenna 110. The antenna 110 is arranged to create a plasma in a plasma chamber (not shown) by generating an RF current in response to an RF signal received from the RF assembly 104, as in known ICP antennas. The antenna 110 is arranged in a loop structure that has a first leg 110A, that extends from a first terminal end A of the antenna 110, along a direction parallel to an antenna axis AX (for reference, the antenna axis AX is aligned parallel to the X-axis of the Cartesian coordinate system shown). The loop structure of antenna 110 includes a second leg 110B, extending from a second terminal end C, also parallel to the antenna axis AX, and further includes a middle section 110C, joining the first leg 110A and the second leg 110B.

As illustrated, the antenna 110 is arranged in proximity to a dielectric window 112, which component may be formed of known dielectric material. In some embodiments, the dielectric window 112 may be arranged as a dielectric cylinder that surrounds the antenna110 and has a cylinder axis that extends parallel to the antenna axis. In those embodiments, the dielectric window 112 (meaning a dielectric cylinder) may extend within a plasma chamber, such that the antenna 110 is isolated from gaseous species that generate a plasma that surrounds the dielectric cylinder. In other embodiments, the dielectric window may be arranged as a planar plate that is disposed on a side of a plasma chamber, where the antenna 110 is disposed on an outside of the plasma chamber.

The antenna assembly 102 further includes a Faraday shield assembly 116, disposed between the antenna 110 and the dielectric window 112. According to various embodiments of the disclosure, the Faraday shield assembly 116 may be disposed at least partially around the antenna 110. As illustrated in FIG. 1A, the Faraday shield assembly 116 is formed of a plurality of metallic sections, which sections are electrically isolated from one another, such as by dielectric gaps 114. These sections are shown as section 116A, section 116B, section 116C, section 116D, section 116E, section 116F, section 116G, and section 116H. As further depicted in FIG. 1A, the metallic sections are arranged into a plurality of shield pairs. In a given shield pair, such as represented by shield pair 120, including section 116A and section 116B, a first metallic section and second metallic section are disposed opposite one another. In addition, the first metallic section, such as section 116A, and second metallic section, such as section 116B, are electrically connected to one another, via an electrical conductor 122, which conductor may be a metal wire or other electrical conductor. As such, each section of the Faraday shield assembly 116 is electrically connected to one other section, and is electrically isolated from all other sections of the Faraday shield assembly.

In various embodiments the plurality of metallic sections that make up a Faraday shield assembly 116 are arranged coaxially around the antenna 110. In other words, a given metallic section of the Faraday shield assembly 116 will be arranged around a given leg of the Faraday shield assembly as a cylinder or partial cylinder that has a cylinder axis coincident with an axis of the given leg. In other words, the metallic sections of the Faraday shield assembly 116 will be arrange equidistantly from the antenna 110, along the length of the antenna 110. More particularly, the perpendicular distance D from antenna 110 to metallic section will be constant along the Faraday shield assembly 116. This relationship is illustrated in more detail with respect to FIG. 3A and FIG. 3B, discussed below. An advantage of this relationship is that all metallic sections of the Faraday shield assembly 116 will exhibit an equal capacitance.

In operation, when an RF signal is applied to the antenna 110, a voltage will develop along the length of the antenna 110. The voltage may be represented as an electrostatic or DC potential that varies along the length of the antenna. Because of the partition of the Faraday shield assembly 116 into electrically isolated shield pairs, the voltage along the Faraday shield assembly 116 will be limited. In particular, the middle region of each metallic section and the electrical conductor 122 will float near zero RF potential, turning the metallic sections into to a virtual ground. This circumstance may avoid the voltage in the sheath near the first terminal end A and second terminal end C from becoming unacceptably high. Recall that the plasma inside an ideal electrostatically isolated inductively coupled plasma does not acquire any RF potential towards the plasma boundaries i.e., towards the dielectric window and the chamber walls of a plasma chamber, due to the circular geometry of the induced electric field.

Recall further that at the plasma edge, just an intrinsic DC potential of approximately 10 V-30 V will develop across the plasma boundary sheath. While RF voltage at a plasma chamber wall sheath can be minimized by applying a balanced drive to an antenna, in the absence of the Faraday shield assembly 116, the voltage at the sheath developed at the dielectric window boundary may still be significant. This voltage is illustrated by the solid line in FIG. 2, which voltage may be a maximum at first terminal end A and second terminal end C.

Unshielded portions of a dielectric window 112 (meaning antenna configurations where the Faraday shield assembly 116 is absent) that are near the first terminal end A and near the second terminal end C will be exposed to a voltage at maximum value.

However, as illustrated in FIG. 2, in the presence of the Faraday shield assembly 116, the use of "n" shield pairs will reduce the maximum voltage of the antenna 110 by a factor of n. In particular, the X-axis of FIG. 2 represents the position from first terminal end A to second terminal end C, along the antenna 110. In the representation of FIG. 2, the configuration of FIG. 1 is assumed, where four shield pairs are present. The effect of a given shield pair is to limit the maximum voltage as shown, where the voltage along a given shield pair is represented by the inclined line segments. As shown, the voltage varies from a maximum positive value to a maximum negative value along each of eight different line segments, representing the eight different metallic sections of the Faraday shield assembly of FIG. 1. However, the amplitude of the maximum voltage in each of these regions reaches a value of just V/n or −V/n, where V represents the maximum voltage along the antenna if not protected by the Faraday shield assembly 116.

Since the erosion rate of the dielectric window 112 may depend exponentially on the sheath voltage, any erosion will be reduced significantly by reducing maximum voltage by a factor of N.

In order to preserve the inductive coupling between an antenna 110 and a plasma, various embodiments of disclosure arrange the Faraday shield assembly 116 or similar variants so that the shield surfaces normal to the antenna radiated magnetic field are minimized. This circumstance is best realized by arranging the shield metallic sections to be coaxial with the antenna legs, as mentioned above with respect to FIG. 1. An ideal coaxial screen that is disposed around a long radiating rod will not impede the antenna magnetic field. In the case of an antenna having a loop shape, as in the present embodiments, some magnetic field distortions will occur due to proximity of the two different antenna legs. This magnetic field distortion effect can be minimized by arranging metallic sections to just partially surround a given leg of the antenna 110 in a manner where portions of the metallic sections are not present in the region of each metallic section facing the opposite leg. This configuration is depicted in some of the figures to follow.

Turning now to FIG. 3A there is shown an end cross-sectional view of an antenna assembly arranged according to additional embodiments of the disclosure. FIG. 3B illustrates a side view of the antenna assembly of FIG. 3A. In FIG. 3A, a metallic section 216A is shown that is arranged as a partial cylinder having a cylinder axis extending parallel to the X-axis. The metallic section 216A may be arranged to surround the first leg 110A in a co-axial manner with the first leg 110A, for example, where the axis of the first leg 110A coincides with the cylinder axis of the metallic section 216A. Likewise, other metallic sections, such as metallic section 216C, metallic section 216E, metallic section 216G may be arranged concentrically and coaxially with the first leg 110A, such that these additional sections are not visible in the view of FIG. 3A. In the embodiment of FIG. 3A the metallic section 216A has a C-shape in cross-section, where the open part of the C faces the opposite leg, meaning the second leg 110B.

In a manner analogous to metallic section 216A, the metallic section 216B may be arranged to surround the second leg 110B in a co-axial manner with the second leg 110B, for example, where the axis of the second leg 110B coincides with the cylinder axis of the metallic section 216B. Likewise, other metallic sections, such as metallic section 216D, metallic section 216F, metallic section 216H may be arranged concentrically and coaxially with the second leg 110B, such that these additional sections are not visible in the view of FIG. 3A. In the embodiment of FIG. 3A the metallic section 216B also has a C-shape in cross-section, where the open part of the C faces the opposite leg, meaning the second leg 110B. As noted, this 'open' configuration of the metallic sections of the Faraday shield assembly 216 will tend to reduce any magnetic field distortions arising from the close proximity of first leg 110A and second leg 110B.

Figures 3C, 3D:
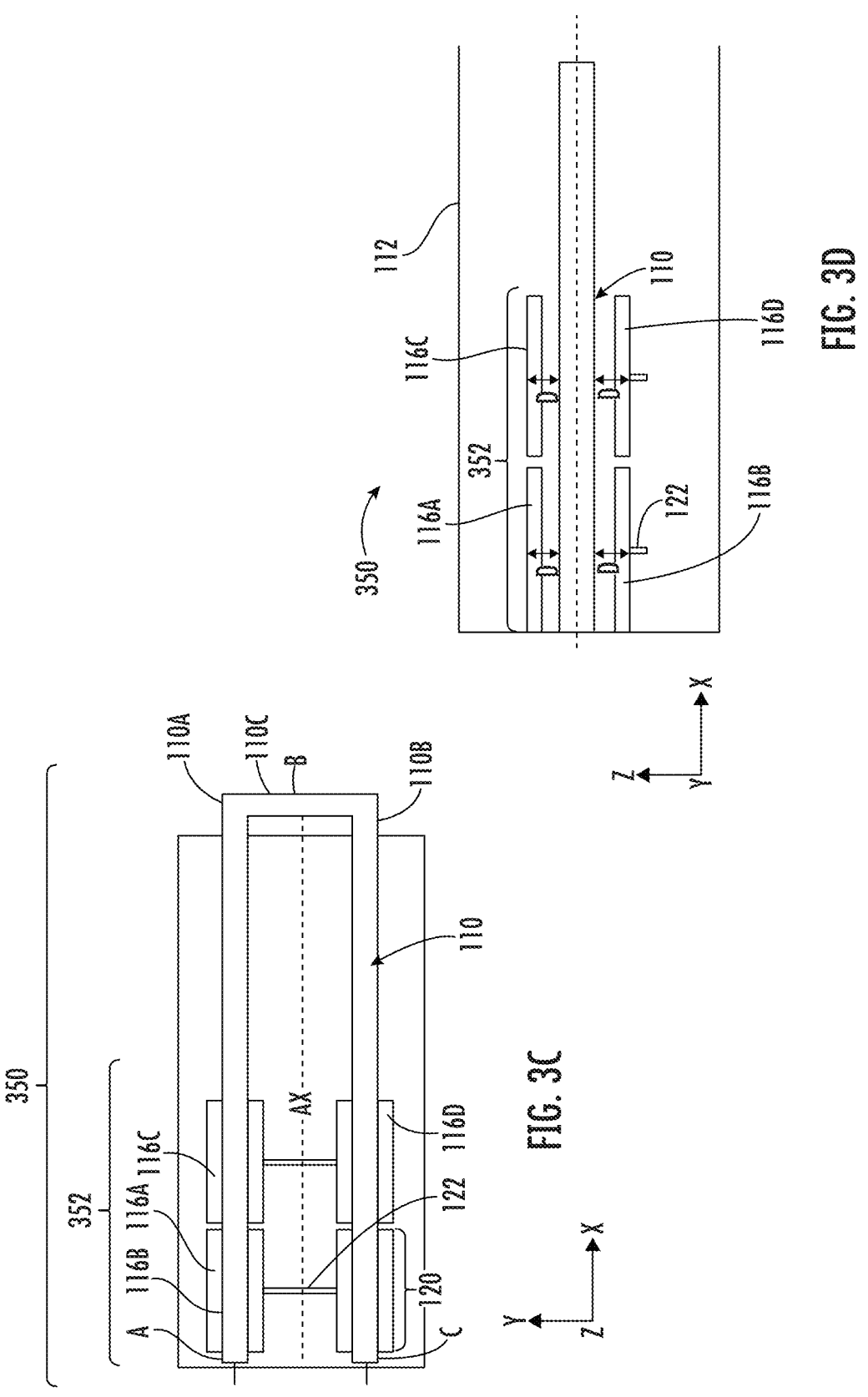
FIG. 3C shows another antenna assembly, according to embodiments of the disclosure.
FIG. 3D illustrates a side view of the antenna assembly of FIG. 3C.

FIG. 3C shows another antenna assembly, according to embodiments of the disclosure. FIG. 3D illustrates a side view of the antenna assembly of FIG. 3C. In this embodiment, the antenna assembly 350 may be configured similarly to antenna assembly 102, with like parts labeled the same. In this embodiment, a Faraday shield assembly is provided so as to cover relatively higher voltage portions of the antenna 110, while leaving relatively lower voltage portions closer to the middle section B exposed. Said differently, the Faraday shield assembly 352 is just disposed around a first region of the antenna 110 that is disposed toward the first terminal end A and the second terminal end C, and is not disposed around a second region of the antenna 110 that is relatively closer to the middle section B. This embodiment has the advantage of providing more efficiency of coupling to a plasma.

Figure 4:
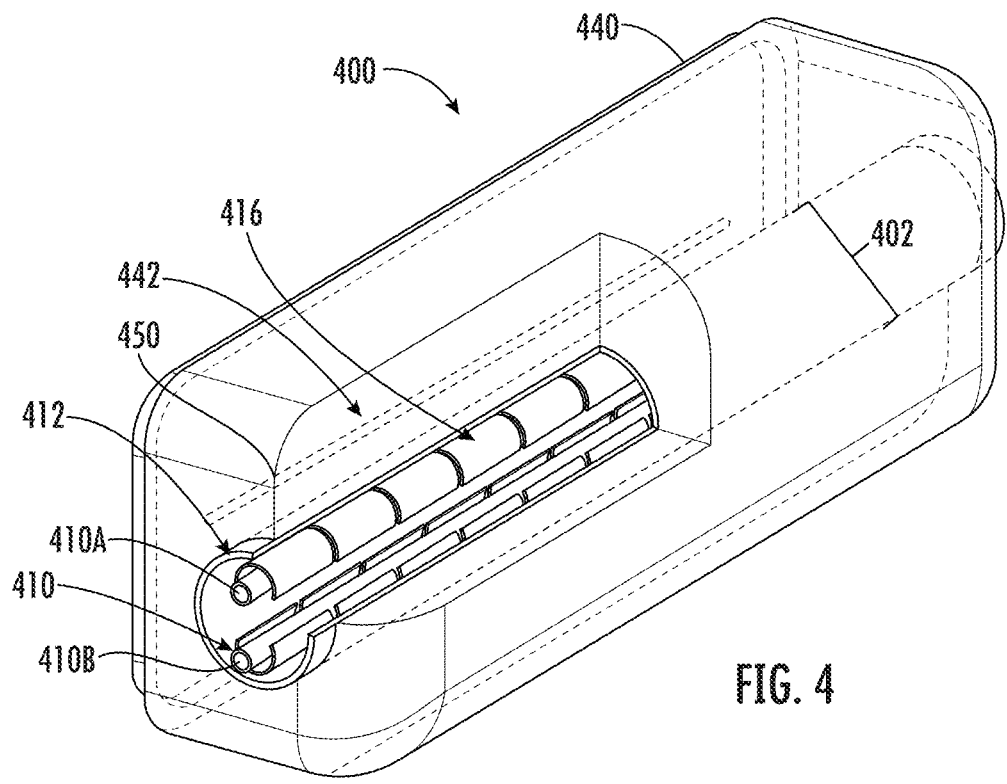
FIG. 4 illustrates a plasma source, according to some embodiments of the disclosure.

FIG. 4 illustrates a plasma source 400, according to some embodiments of the disclosure. In this embodiment, the plasma source 400 is driven by an antenna assembly 402, which assembly may be arranged similarly to the antenna assembly 102 or antenna assembly 202. As such the antenna assembly 402 includes a dielectric window 412, configured as a cylinder, an antenna 410, configured as a loop antenna, as well as a Faraday shield assembly 416, arranged in shield pairs where a given metallic section of each shield pair surrounds the first leg 410A or the second leg 410B, as shown. The dielectric window 412 may isolate the antenna 410 from the region surrounding the antenna assembly 402 within the plasma chamber 440. Thus, a plasma volume 442 may define a plasma therein, where the plasma volume 442 surrounds the antenna assembly 402, in a manner that gaseous species from the plasma volume 442 are excluded from the interior of the cylinder formed by the dielectric window 412. In operation, when a plasma is ignited by the antenna assembly 402, an ion beam may be extracted through an aperture 450 provided in the plasma chamber 440.

In additional embodiments of an antenna assembly, a Faraday shield assembly may be formed of a plurality of metallic sections, generally arranged as in the previously disclosed embodiments, with one modification where the metallic sections include an array of perforations (openings) that facilitate heat transfer and cooling of the antenna assembly. For example, referring to FIG. 4, the Faraday shield assembly 416 may include openings in each metallic shield. In addition, compressed air may be provided that flows through the perforations in the metallic sections and reaches an inner surface 212A of the dielectric window 212 (see FIG. 3B).

Figures 5A, 5B:
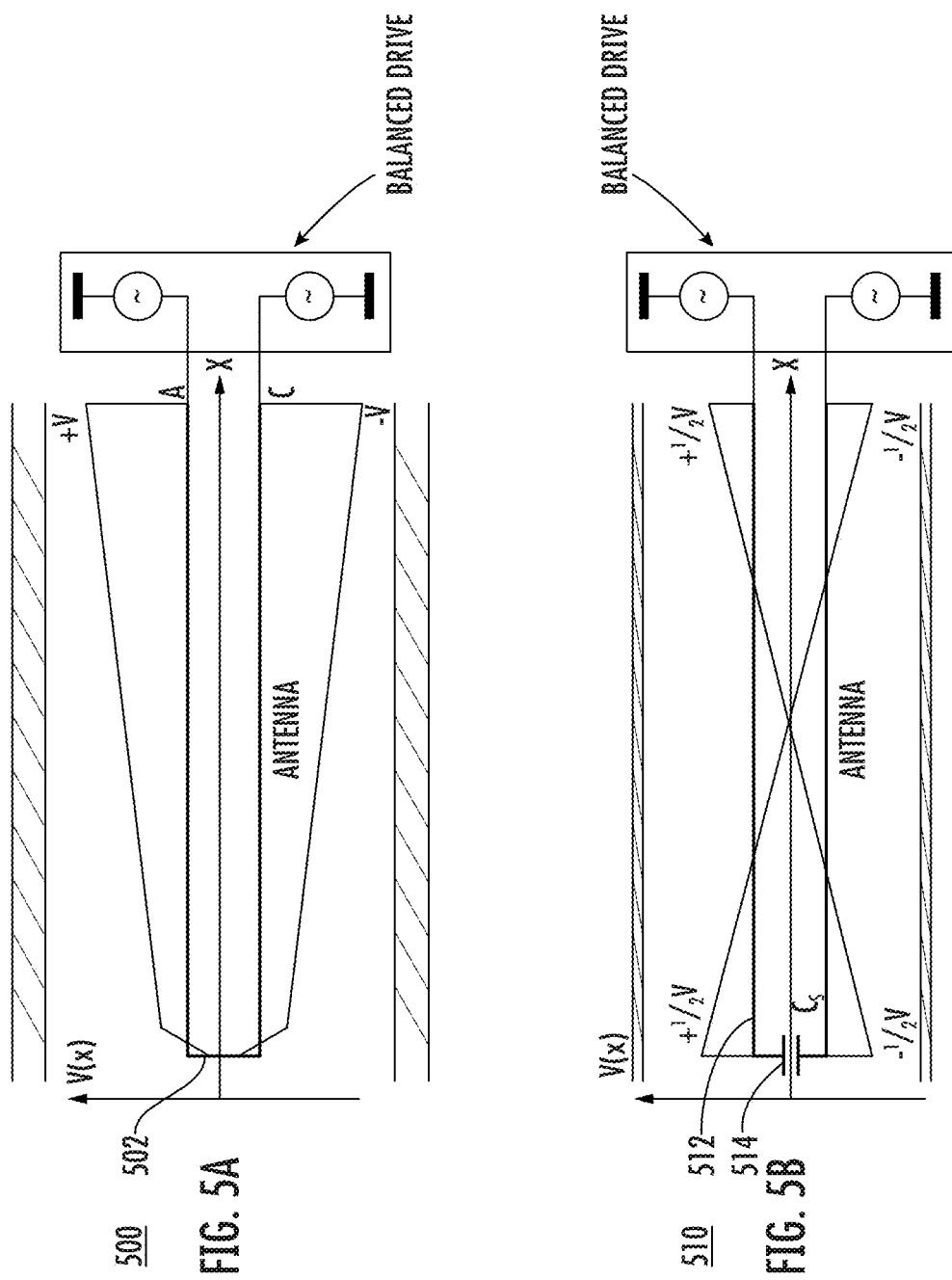
FIG. 5A is a composite illustration, showing an embodiment of an antenna circuit and concomitant voltage distribution along the antenna of the antenna circuit.
FIG. 5B is a composite illustration, showing an embodiment of an additional antenna circuit and concomitant voltage distribution along the antenna of the additional antenna circuit.

FIG. 5A is a composite illustration, showing an embodiment of an antenna circuit and concomitant voltage distribution along the antenna of the antenna circuit, while FIG. 5B is another composite illustration, showing an embodiment of an additional antenna circuit and concomitant voltage distribution along the antenna of the additional antenna circuit. In the embodiment of FIG. 5A, a circuit arrangement 500 is shown, including a balancing network provided to generate a balanced drive voltage to a loop antenna 502. Thus, the antenna voltage at first terminal end A may be equal to and opposite the voltage at second terminal end C, as illustrated. Note that an imperfection of the balancing network may result in deviation of paired shield sections from zero potential.

In the circuit arrangement 510 of the embodiment of FIG. 5B, a splitting capacitor 514 is inserted in the loop antenna 512, mitigating this effect. The splitting capacitor 514 reduces "hot spot" voltage at the first terminal end A and second terminal end C by the factor of 2 (the voltage also increases in the middle section of the loop antenna 512, but the maximum voltage seen along the loop antenna 512 is reduced by a factor of 2 compared to the embodiment of FIG. (5A). Moreover, the deviation of the shield section potential for a Faraday shield assembly surrounding the loop antenna 512 will be reduced by the same amount (see inclined line segments, representing shield voltage as a function of position along the antenna).

Figure 6B:
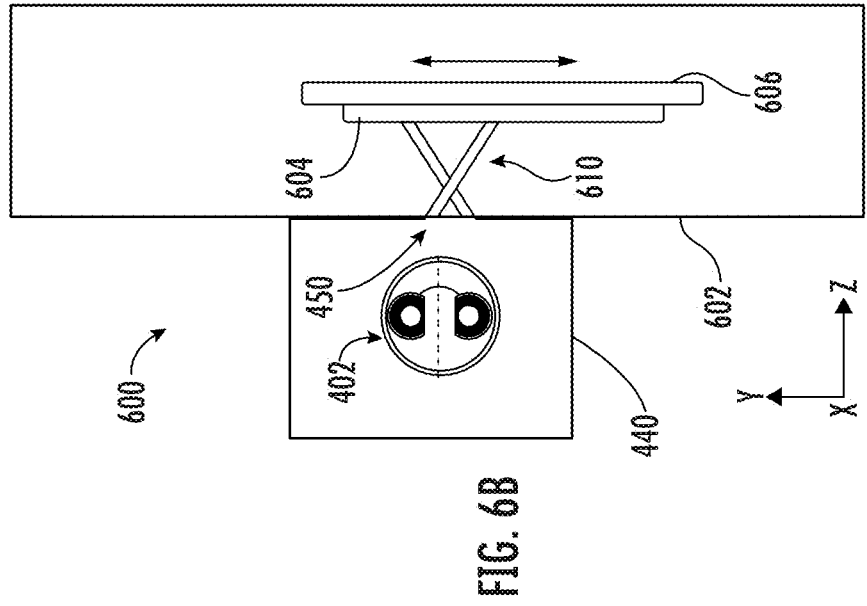
FIG. 6B presents an end cross-sectional view of the processing system of FIG. 6A.
Figure 6A:
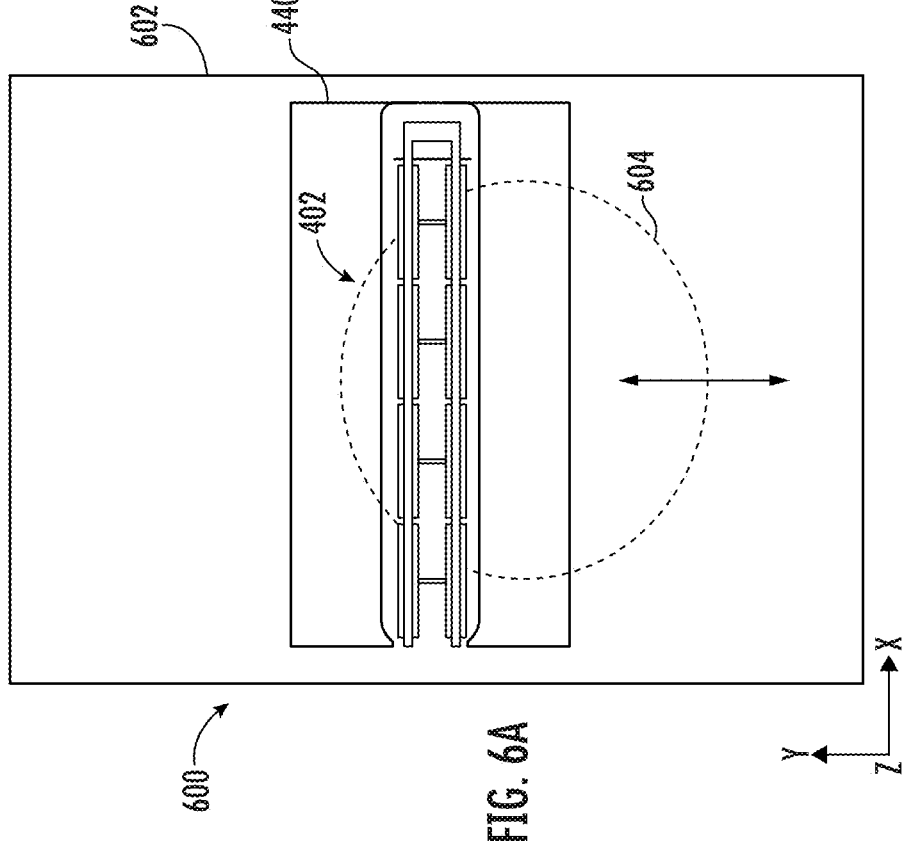
FIG. 6A presents a top plan view of an exemplary processing system according to another embodiment of the disclosure.

FIG. 6A presents a top plan view of an exemplary processing system according to another embodiment of the disclosure, while FIG. 6B presents an end cross-sectional view of the processing system of FIG. 6A.

In one variant, the system 600 includes the aforementioned components of the plasma source of FIG. 4, where like components are labeled the same. In this view, a processing chamber 602 is disposed to house a substrate 604 that may be scanned along the Y-axis with respect to extraction aperture 450. As illustrated in the end cross-sectional view of FIG. 6B, an ion beam 610 may be extracted from the plasma source 400. The ion beam 610 may be formed by two ion beamlets which beamlets impinge upon the substrate 604 at a symmetrically non-zero angles with respect to a perpendicular (meaning the Z-axis) to a main plane of the substrate 604 (meaning the X-Y plane in this example). As such, with the aid of scanning a substrate holder 606 along the Y-direction, an entirety of the substrate 604 may be exposed to an angled ribbon ion beam that is elongated to cover the substrate along the X-axis (see FIG. 6A). In the view of FIG. 6B it may be assumed that a blocker is present near the extraction aperture 450, leading to the extraction of two-symmetrically angled beamlets that form the totality of ion beam 610, as in known extraction assemblies. However, in some embodiments, just a single ion beamlet may be extracted from an extraction aperture. During operation, the plasma source 400 will not generate substantial erosion of the dielectric cylinder of antenna assembly 402, due to the improved design, using a Faraday shield assembly arranged according to the aforementioned embodiments.

In view of the above, the present disclosure provides at least the following advantages. As a first advantage, the erosion of an RF window used with an ICP antenna may be reduced using the new Faraday shield assembly. In a second advantage, a more efficient antenna-to-plasma coupling and low power loss is facilitated due to the shield topology of the Faraday shield assembly according to the present embodiments. #antenna-to-plasma coupling and low power loss is facilitated due to the shield topology of the Faraday shield assembly according to the present embodiments. #

While certain embodiments of the disclosure have been described herein, the disclosure is not limited thereto, as the disclosure is as broad in scope as the art will allow and the specification may be read likewise. Therefore, the above description are not to be construed as limiting. Thus, a variable opacity Faraday shield of adequate shape and topology may be used in conjunction with solenoidal antenna, flat spiral antenna, helical antenna, or circular antenna to mitigate the detrimental effect of variable voltage distribution along their length. Those skilled in the art will envision such modifications within the scope and spirit of the claims appended hereto.

The invention claimed is:

1. An antenna assembly, comprising: an antenna assembly, comprising: an antenna, having a loop structure; a dielectric window, adjacent to the antenna; and
   a Faraday shield assembly disposed between the antenna and the dielectric window, the Faraday shield assembly being disposed at least partially around the antenna, wherein the Faraday shield assembly comprises a plurality of circumferentially opposed shield pairs, each shield pair being electrically isolated from adjacent shield pairs along the length of the antenna, each shield pair including a first metallic section and a second metallic section disposed opposite one another about the loop structure and electrically connected to one another only within the shield pair and not to any other metallic section, whereby each shield pair defines a localized equipotential region configured to minimize capacitive coupling to a plasma while maintaining magnetic coupling between the antenna and the plasma.

2. The antenna assembly of claim 1, wherein the antenna has a first terminal end and a second terminal end, disposed adjacent the first terminal end,
   wherein the loop structure has a first leg, extending from the first terminal end parallel to an antenna axis, a second leg, extending from the second terminal end parallel to the antenna axis, and a middle section, joining the first leg and the second leg, and
   wherein the first metallic section is disposed around the first leg and the second metallic section is disposed around the second leg.

3. The antenna assembly of claim 2, wherein the dielectric window is configured as a dielectric cylinder that surrounds the antenna and has a cylinder axis that extends parallel to the antenna axis.

4. The antenna assembly of claim 1, wherein the plurality of metallic sections are arranged coaxially around the antenna.

5. The antenna assembly of claim 4, wherein the plurality of metallic sections are arranged equidistantly from the antenna along a length of the antenna.

6. The antenna assembly of claim 4, wherein the plurality of metallic sections have a C-shape in cross-section.

7. The antenna assembly of claim 6, wherein the loop structure has a first leg and a second leg, wherein an open part of the first metallic section of the given shield pair faces an open part of the second metallic section of the given shield pair.

8. The antenna assembly of claim 2, wherein the Faraday shield assembly is disposed around a first region of the antenna that is disposed toward the first terminal end and the second terminal end, and wherein the Faraday shield assembly is not disposed around a second region of the antenna that is relatively closer to the middle section.

9. A plasma source, comprising: a plasma chamber, the plasma chamber surrounding a plasma space to contain a plasma therein; and an antenna assembly, disposed within the plasma chamber or adjacent to the plasma chamber, the antenna assembly comprising: an antenna, having a loop structure; a dielectric window, adjacent to the antenna; and a Faraday shield assembly disposed between the antenna and the dielectric window, the Faraday shield assembly being disposed at least partially around the antenna, wherein the Faraday shield assembly comprises, a plurality of circumferentially opposed shield pairs, each shield pair being electrically isolated from adjacent shield pairs along the length of the antenna, each shield pair including a first metallic section and a second metallic section disposed opposite one another about the loop structure and electrically connected to one another only within the shield pair and not to any other metallic section, wherein the Faraday shield assembly is configured to limit voltage buildup along the antenna and to maintain magnetic coupling to the plasma through gaps defined between adjacent shield pairs.

10. The plasma source of claim 9, wherein the antenna has a first terminal end and a second terminal end, disposed adjacent the first terminal end, wherein the loop structure has a first leg, extending from the first terminal end parallel to an antenna axis, a second leg, extending from the second terminal end parallel to the antenna axis, and a middle section, joining the first leg and the second leg, and wherein the first metallic section is disposed around the first leg and the second metallic section is disposed around the second leg.

11. The plasma source of claim 10, wherein the dielectric window is configured as a dielectric cylinder that surrounds the antenna and has a cylinder axis that extends parallel to the antenna axis.

12. The plasma source of claim 9, wherein the plurality of metallic sections are arranged coaxially around the antenna.

13. The plasma source of claim 12, wherein the plurality of metallic sections are arranged equidistantly from the antenna along a length of the antenna.

14. The plasma source of claim 12, wherein the plurality of metallic sections have a C-shape in cross-section.

15. The plasma source of claim 14, wherein the loop structure has a first leg and a second leg, wherein an open part of the first metallic section of the given shield pair faces an open part of the second metallic section of the given shield pair.

16. The plasma source of claim 10, wherein the Faraday shield assembly is disposed around a first region of the antenna that is disposed toward the first terminal end and the second terminal end, and wherein the Faraday shield assembly is not disposed around a second region of the antenna that is relatively closer to the middle section.

17. A processing apparatus, comprising:

a plasma chamber surrounding a plasma space to contain a plasma therein; and an antenna assembly, disposed within the plasma chamber or adjacent to the plasma chamber, the antenna assembly comprising:

an antenna having a loop structure;

a dielectric window positioned between the antenna and the plasma chamber, adjacent to the antenna; and a Faraday shield assembly disposed between the antenna and the dielectric window, the Faraday shield assembly being disposed at least partially around the antenna, wherein the Faraday shield assembly comprises a plurality of metallic sections arranged into circumferentially opposed shield pairs, each pair including two metallic sections electrically connected only to each other and electrically isolated from other shield pairs; and an RF power source configured to apply a balanced RF signal to the antenna so that each shield pair defines a localized equipotential region that reduces capacitive coupling to the plasma while preserving magnetic coupling through inter-pair gaps.

18. The processing apparatus of claim 17, wherein the RF assembly is arranged to deliver a first RF signal to the first terminal end, having a first maximum amplitude and a first phase, and is further arranged to deliver a second RF signal to the second terminal end, having the first maximum amplitude and a second phase, opposite to the first phase.

19. The processing apparatus of claim 17, the RF assembly comprising an RF balancing network.

\* \* \* \* \*